United States Patent [19]

Stone et al.

[11] Patent Number: 5,767,778
[45] Date of Patent: Jun. 16, 1998

[54] EVENT SENSING CIRCUIT AND ALERT GENERATOR

[75] Inventors: Garrett B. Stone, Tiburon; Bobby Dale Gifford, Oakland, both of Calif.

[73] Assignee: Aspire Corporation, Tiburon, Calif.

[21] Appl. No.: 611,680

[22] Filed: Mar. 6, 1996

[51] Int. Cl.[6] .................... G08B 21/00; H04M 3/22; H02J 7/16
[52] U.S. Cl. .................... 340/636; 340/635; 379/34; 379/33; 320/48
[58] Field of Search ................... 340/636, 428, 340/825.44, 635; 320/48, 2; 324/427; 429/90; 379/33, 34, 1, 372, 373, 374, 375, 376, 377, 378

[56] References Cited

U.S. PATENT DOCUMENTS

| | | | |
|---|---|---|---|
| 4,214,131 | 7/1980 | Bush et al. | 179/84 T |
| 4,421,953 | 12/1983 | Zielinski | 179/2 EC |
| 4,555,592 | 11/1985 | Deinzer | 179/2 E |
| 4,641,370 | 2/1987 | Oyamada | 455/348 |
| 4,669,108 | 5/1987 | Deinzer | 379/61 |
| 4,747,122 | 5/1988 | Bhagat et al. | 379/57 |
| 4,833,709 | 5/1989 | Pasinski et al. | 379/374 |
| 4,845,772 | 7/1989 | Metroka et al. | 379/61 |
| 4,903,325 | 2/1990 | Yoshitake et al. | 455/89 |
| 4,914,393 | 4/1990 | Yoshido | 340/636 |
| 4,965,738 | 10/1990 | Bauer et al. | 320/48 |
| 5,025,467 | 6/1991 | Wheller | 379/60 |
| 5,047,961 | 9/1991 | Simonsen | 340/636 |
| 5,109,539 | 4/1992 | Inubushi et al. | 455/89 |
| 5,140,310 | 8/1992 | DeLuca et al. | 340/636 |
| 5,201,067 | 4/1993 | Grube et al. | 455/89 |
| 5,206,097 | 4/1993 | Burns et al. | 429/90 |
| 5,245,694 | 9/1993 | Zwern | 395/2 |
| 5,248,929 | 9/1993 | Burke | 320/48 |
| 5,251,329 | 10/1993 | Takagi et al. | 455/89 |
| 5,278,907 | 1/1994 | Snyder et al. | 380/48 |
| 5,333,176 | 7/1994 | Burke et al. | 379/58 |
| 5,355,072 | 10/1994 | Satsuma et al. | 320/48 |
| 5,404,391 | 4/1995 | Wavroch et al. | 379/59 |
| 5,410,599 | 4/1995 | Crowley et al. | 380/9 |
| 5,420,911 | 5/1995 | Dahlin et al. | 379/59 |
| 5,434,508 | 7/1995 | Ishida | 324/427 |
| 5,446,783 | 8/1995 | May | 379/59 |
| 5,463,380 | 10/1995 | Matai | 340/636 |
| 5,479,084 | 12/1995 | Satsuma et al. | 320/48 |
| 5,638,421 | 6/1997 | Serrano et al. | 379/34 |

FOREIGN PATENT DOCUMENTS

| | | | |
|---|---|---|---|
| 2070493 | 2/1993 | Canada | 455/343 |
| 445808 | 3/1991 | European Pat. Off. | 455/90 |
| 5-41686 | 2/1993 | Japan | 455/343 |

OTHER PUBLICATIONS

Radio Shack 1985 Catalog No. 380, p. 164.

Primary Examiner—Brent A. Swarthout
Assistant Examiner—Van T. Trieu
Attorney, Agent, or Firm—Aquilino & Welsh

[57] ABSTRACT

An event sensor circuit monitors power consumption patterns of a device to determine occurrence of particular operations by the device. In response to detection of one or more particular operations the event sensor signals an alert generator to generate an alert. The system may be implemented within a replaceable battery pack or in an add-on package to monitor power consumption of the device and generate an alert. The event sensor circuit and alert generator utilizes a microprocessor which can be programmed to accommodate pattern detection in a variety of devices. The event sensor circuit and alert generator can be used as an alternative or supplemental alert signal source for a device and can be user selectively enabled or disabled and user selectively set to provide a variety of alert signals. The alert generator can be user programmable to provide a fully customized alert.

24 Claims, 7 Drawing Sheets

EVENT SENSING CIRCUIT AND ALERT GENERATOR

FIELD OF THE INVENTION

This invention relates to the field of sensing events and generating alerts for devices.

BACKGROUND OF THE INVENTION

Cellular telephones and other battery-powered devices have become very common in daily life. These devices typically issue an acoustical alert when a message arrives from an outside caller. An acoustical alert, however, is often not recognizable because of the environmental noise level, or may be disruptive, such as in a meeting or a theater.

Cellular telephones and other battery-powered devices often use a replaceable battery pack which has a limited number of recharge cycles, after which the battery pack must be replaced by a new battery pack.

It is known in the prior art to provide apparatus for modifying the alert, or ringing signal, of a telephone.

In U.S. Pat. No. 5,025,467 to Wheller a signal representing the ring signal inside a standard telephone is tapped and fed to an auxiliary device for generating a desired alert. This implementation involves accessing active signal lines, which may require opening an otherwise warranted standard telephone.

In U.S. Pat. No. 5,404,391 to Wavroch et al. a receiver tuned to the carrier frequency of a cellular telephone is used to monitor the activities of a cellular telephone and generate an alert. This embodiment requires the use of a wireless signal receiving device which is notoriously susceptible to false alerts.

In U.S. Pat. No. 5,446,783 to May an infrared element is added to a replaceable battery pack. The patent is not directed toward generating an alert.

SUMMARY OF THE INVENTION

It is an object of the present invention to provide an auxiliary alert generator attachable to a portable device or cellular telephone by interconnection only to power lines of a battery powering a portable device or cellular telephone.

It is another object of the invention to provide an auxiliary alert generator which does not require connection to active signal lines of a portable device or cellular telephone for detecting an occurrence of a predetermined event.

It is a further object of the present invention to provide a reliable system with no wired connection to an active signal line which is more discriminatory in correctly recognizing incoming calls and rejecting false alerts than devices known up to now.

It is still another object of the invention to provide an auxiliary alert generator which can be discarded with a used battery pack.

It is still another object of the invention to provide an add-on auxiliary alert generator interconnection package which can be used with a standard battery pack of a portable device or cellular telephone.

It is still another object of the invention to provide an auxiliary alert generator with selectable modes of operation.

It is still another object of the invention to provide a user selectable acoustical alert or vibration generator as an auxiliary alert.

The present invention achieves these objects and overcomes the abovementioned prior art problems by including within a replaceable battery pack, or as an add-on interconnection package usable with a standard replaceable battery pack, an event sensing circuit and alert generator. The event sensor and alert generator of the present invention can be used as an alternative to or in conjunction with the acoustic alert of a portable device which is activated upon detection of a predetermined event, such as an incoming call alert of a cellular telephone.

The replaceable battery pack or add-on device of the present invention includes an event sensor and an alert generator which generates an alert upon detection of a predetermined event. The replaceable battery pack or interconnection package with event sensor and alert generator is intended for use in combination with portable electronic devices including communication devices, such as cellular telephones. The present invention detects an event, such as the arrival of an incoming call, and activates an alert generator. The replaceable battery pack or interconnection package with event sensor and alert generator is intended for use in high noise environments, such as industrial locations where an acoustical alert might not be heard, and in low noise environments, such as business meetings or theaters, where the generation of an audible alert would be disruptive.

The present invention overcomes these difficulties in a quite simple way by monitoring power consumption of an electronic device, and identifying certain events by analyzing patterns of past and present power consumption values.

Other objects and advantages of the present invention will become apparent from the following detailed description when viewed in conjunction with the accompanying drawings, which set forth certain embodiments of the invention.

BRIEF DESCRIPTION OF THE INVENTION

The event sensor and alert generator of the present invention uses event detection circuitry, such as current sensing apparatus, to monitor and analyze present and historical power consumption of a device. In one embodiment, the current sensing apparatus and alert generator may advantageously be contained within a replaceable battery pack for a portable device. This eliminates the need for a specially wired connection to an active signal line inside the portable device. Also, there is no longer a need for the prior art monitoring of wireless signals radiated by a cellular telephone. The present invention may also be implemented as an add-on interconnection package to a standard replaceable battery pack used in combination with a portable device such as a cellular telephone. It should be understood that an event detection circuit and an alert generator could be used in combination with a variety of other portable electronic devices. It should also be understood that it is not necessary to build an event detection circuit and alert generator into a replaceable battery pack in order to achieve the functionality described.

The use of the invention with a cellular telephone is illustrative of the principles embodying the invention. A cellular telephone in standby mode uses a minimum amount of power. However, when a cellular telephone receives an incoming call or a user interacts with a cellular telephone to place an outgoing call, power consumption increases dramatically. Actual power consumption depends on the particular mode of operation. Operating push buttons to perform a function, using back lights for a display panel, and communicating with a cellular network all have typical patterns and levels of power consumption. By using a current sensing circuit connected to a battery of a portable device, such characteristic modes of operation can be identified by a microprocessor. The circuitry of the present invention is designed to identify power consumption patterns denoting an incoming telephone call. Upon detection of such a pattern a microprocessor causes an alert generator to initiate an alert.

Various modes of operation of the auxiliary alert generator may be provided. For example, the auxiliary alert may be tactile (e.g., vibrating), visual (e.g., a light or display) or acoustical (e.g., a tone or recorded sound sample). In addition, an auxiliary alert may take the form of a continuous alert, a periodic alert or an impulse alert. An auxiliary acoustical alert could be, for example, in the form of an alert louder, softer or more musical than the standard acoustical alert of the device. An alternative acoustical alert could also have a variety of user selectable sounds, durations, and other qualities.

DESCRIPTION OF THE PREFERRED EMBODIMENTS

The detailed embodiments of the present invention are disclosed herein. It should be understood, however, that the disclosed embodiments are merely exemplary of the invention, which may be embodied in various forms. Therefore, the details disclosed herein are not to be interpreted as limited, but merely as a basis for the claims and as a basis for teaching one skilled in the art how to make and/or use the invention.

Figure 1:
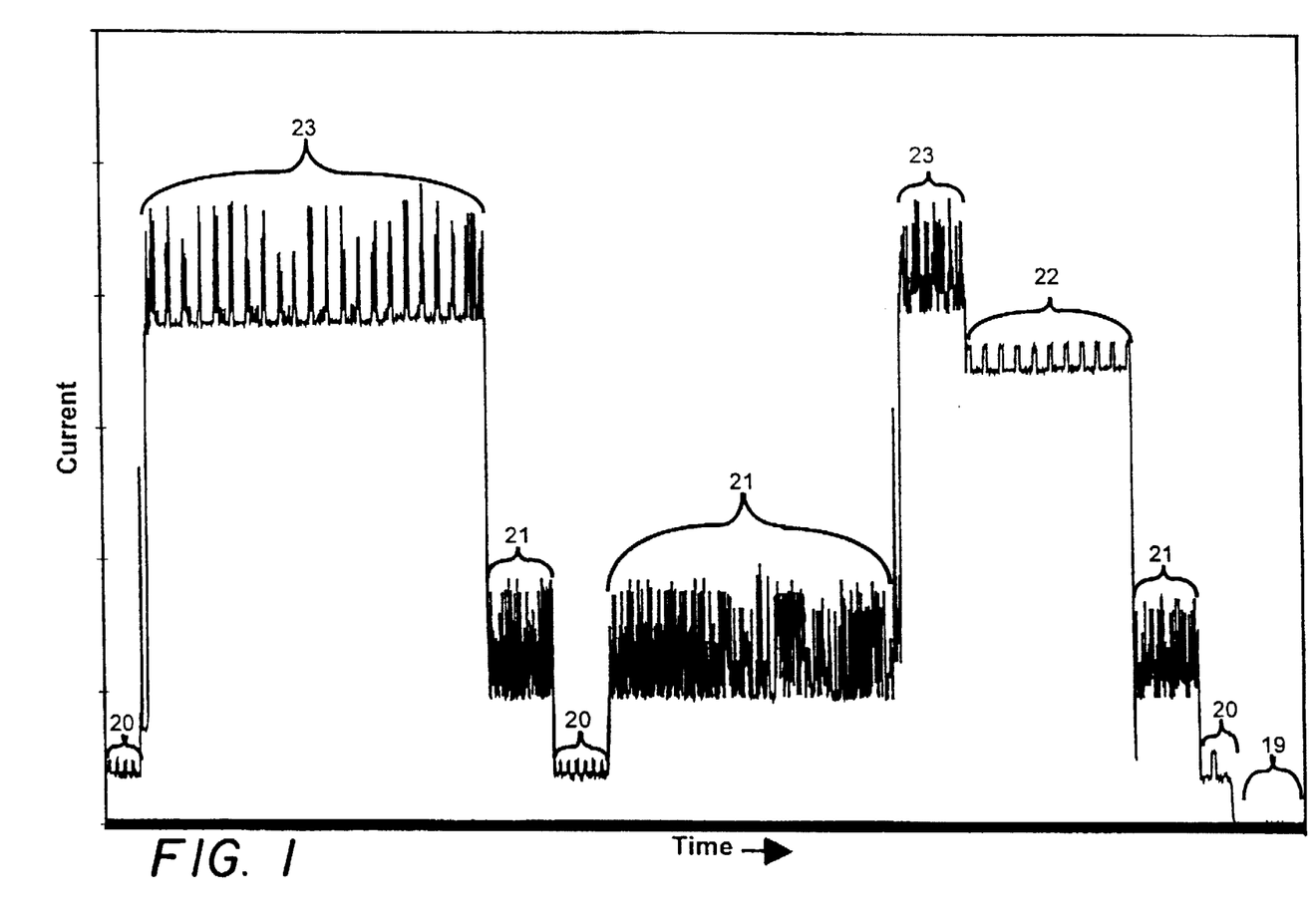
FIG. 1 is a graphic illustration of the power consumption patterns of a typical cellular telephone.

FIG. 1 is a graphic illustration of the typical power consumption of a Cellular Telephone in operation. When not engaged in a communication operation the Cellular Telephone is in a SLEEP mode 20 characterized by minimum operational power consumption. An incoming call increases power consumption to a high level 23 for the duration of a ringing signal. A ringing signal may be followed by a response of a user, which reduces the power consumption to a lower level 22. If a ring is not responded to, Cellular Telephone enters an AWAKE mode with a power consumption 21 which is significantly lower than during a ringing mode 23 or a response mode 22. In a Battery Pack of the present invention an electrical current between a Battery and a Cellular Telephone is monitored and equated to the power consumption. Monitoring is performed periodically by sampling a voltage proportional to the electrical current between a Battery and a Cellular Telephone.

Figure 2:
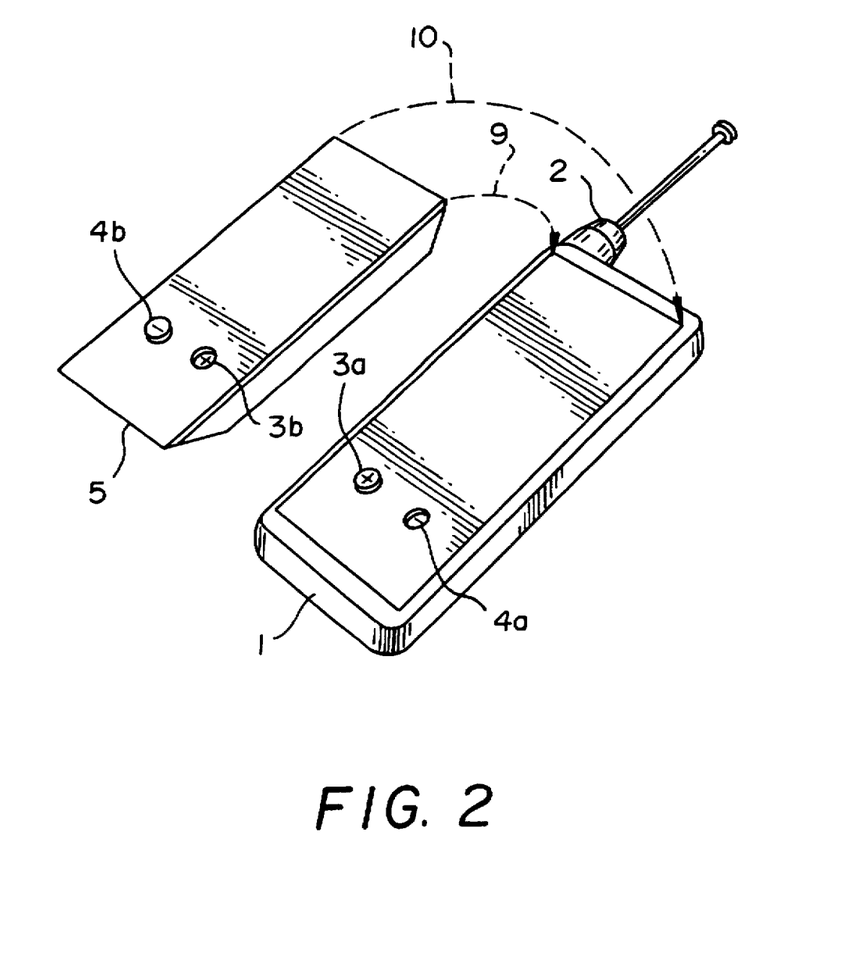
FIG. 2 shows a replaceable battery pack with event sensor and alert generator and a cellular telephone.

FIG. 2 shows a combination of Cellular Telephone 1 and a replaceable Battery Pack 5 with Event Sensing Circuit and Alert Generator. Cellular Telephone 1 includes an Antenna 2. Power is supplied to Cellular Telephone 1 via Power Terminals 3a and 4a. In FIG. 2, Terminal 3a has positive polarity and Terminal 4a has negative polarity. Electrical energy is supplied by Battery Pack 5 which has complementary Terminals 3b and 4b with positive and negative polarity, respectively. Battery Pack 5 is placed over Cellular Telephone 1, as indicated by arrows 9 and 10, and secured by suitable fastening means (not shown). In the configuration shown in FIG. 2 the Event Sensing Circuit and Alert Generator is part of Battery Pack 5.

It is also contemplated that the Event Sensing Circuit and Alert Generator and principles disclosed herein could advantageously be implemented within a device housing which may or may not use a Battery Pack as a source of power.

Figure 3:
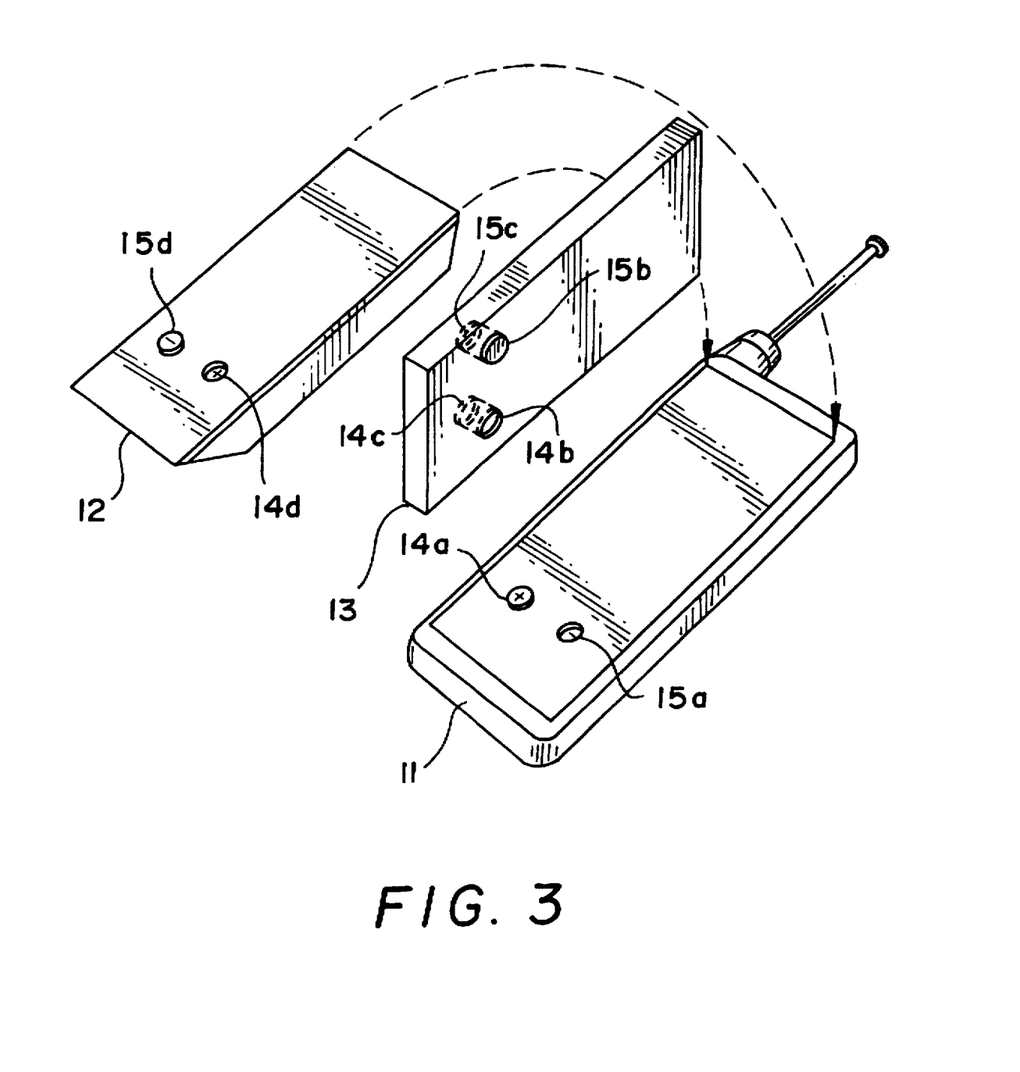
FIG. 3 shows an arrangement of a standard replaceable battery pack, an event sensor and alert generator add-on interconnection package and a cellular telephone.

FIG. 3 shows a Cellular Telephone 11, a Standard Battery Pack 12 and an Event Sensing Circuit and Alert Generator packaged in an add-on Interface Package 13 to be placed between Cellular Telephone 11 and Standard Battery Pack 12. Cellular Telephone 11 includes positive and negative Terminals 14a and 15a which match corresponding Terminals 14b and 15b of the Interface Package 13 containing an Event Sensing Circuit and Alert Generator. On the opposing side of the Interface Package 13 there are Terminals 14c and 15c which connect to matching Terminals 14d and 15d of Standard Battery Pack 12.

While FIG. 3 shows an add-on Interface Package 13 being placed between Standard Battery Pack 12 and Cellular Telephone 11, it is also contemplated that Interface Package 13 could be implemented in other arrangements. For example, Interface Package 13 could advantageously be attached to the bottom of a Cellular Telephone 11 and/or Standard Battery Pack 12, and have contacts on a ribbon cable contacting the necessary Terminals for monitoring power consumption patterns.

In the arrangement of FIG. 2, a Standard Battery Pack (not shown) supplied with Cellular Telephone 1 is exchanged with Battery Pack 5 including an Event Sensing Circuit and Alert Generator. In the arrangement of FIG. 3 an add-on Interface Package 13 is mounted between Standard Battery Pack 12 and Cellular Telephone 11. In either case, the arrangement can be reverted to operation without an Event Sensing Circuit and Alert Generator by reverting to use of a Standard Battery Pack.

Figure 4:
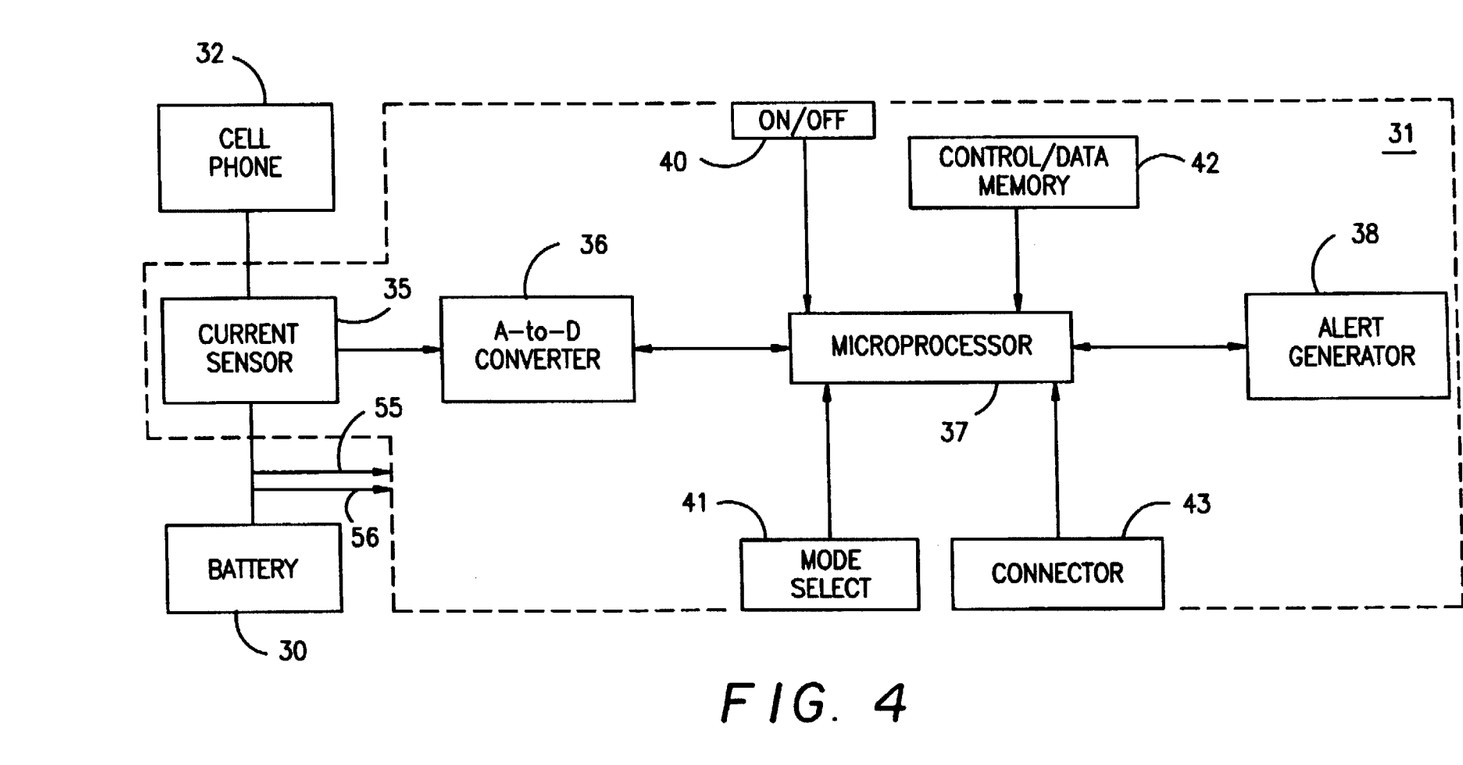
FIG. 4 is a block diagram of a battery, event sensor and alert generator and a cellular telephone.

FIG. 4 shows a combined arrangement of Battery 30, Event Sensor and Alert Generator 31, and Cellular Telephone 32. A Current Sensor 35 is inserted between Battery 30 and Cellular Phone 32. The output of Current Sensor 35 is supplied to an Analog-to-Digital Converter 36 which provides a digital signal representing the supply current supplied by Battery 30 to Cellular Telephone 32. Microprocessor 37 evaluates the digital signal and decides whether an alert should be generated. Microprocessor 37 and the other circuitry of the Event Sensor Circuit and Alert Generator 31 receives power from Battery 30 via lines 55 and 56. Current Sensor 35, Analog-to-Digital Converter 36, Microprocessor 37 and Control/Data Memory 42 comprise the elements generally considered to be the Event Sensing Circuit according to the present invention. These elements are responsible for sensing and analyzing power consumption patterns to determine if certain operations are being performed by the attached device.

It should be understood that while the Figures show particular components, some groups of these components could be a single device without departing from the spirit and scope of the invention. For example, Analog-to-Digital Converter 36 and Microprocessor 37 could be embodied in a single off-the-shelf device.

When Microprocessor 37 detects a specific power consumption pattern characteristic of a specific event, such as an incoming call, it issues an appropriate signal to Alert Generator 38. Microprocessor 37 is connected to Control/Data Memory 42 which contains a sequence of operations and variations thereof in the form of instructions controlling operation of Microprocessor 37.

It is also contemplated that Microprocessor 37 could be replaced by a Field Programmable Gate Array or a hardwired device such as an Application Specific Integrated Circuit (ASIC).

Microprocessor 37 monitors setting of On/Off Switch 40 and Mode Switch 41. On/Off Switch 40 allows a user to enable/disable generation of an auxiliary alert. Mode Switch 41 allows a user to determine the type of auxiliary alert to be generated. For example, an auxiliary alert may be tactile (e.g., vibrating), visual (e.g., a light or display) or acoustical (e.g., a tone or recorded sound sample). An auxiliary alert may be a continuous or periodic alert. An auxiliary alert may start immediately upon detection of a predetermined event or it may be delayed for a time. An auxiliary alert may end when a predetermined event ends or it may continue for a certain time. Variations of type, duration and intensity of the auxiliary alert as well as the particular event characterized by a power consumption pattern of Cellular Telephone 32 can be programmed into Control/Data Memory 42 of Microprocessor 37.

Event Sensor Circuit and Alert Generator 31 is programmed to stay in a very low power consumption mode most of the time. Only at a time of monitoring power consumption of Cellular Telephone 32 does Event Sensor Circuit and Alert Generator 31 operate at increased power consumption. While generating an alert, for example, power consumption of Alert Generator 38 can assume a high level. Various modes of operation allow for reducing average power consumption of Event Sensor Circuit and Alert Generator 31.

Figure 5:
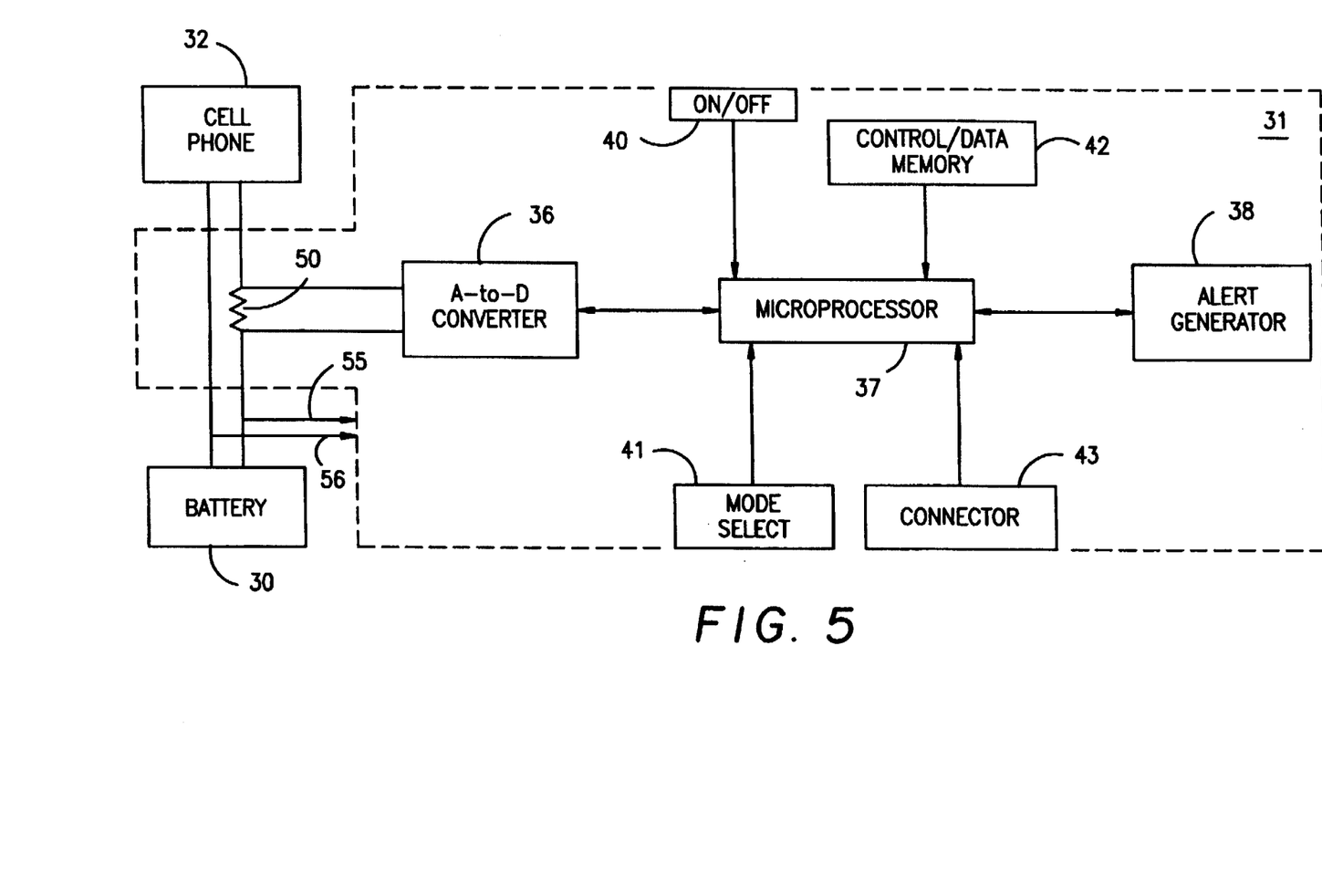
FIG. 5 is an illustration of a current sensor used in conjunction with an electronic device; and, FIGS. 6A and 6B are a flow chart illustrating processing performed in accordance with the present invention.

FIG. 5 is a schematic illustration of a Current Sensor for monitoring power consumption of Cellular Telephone 32. Microprocessor 37 and the other circuitry of the Event Sensor Circuit and Alert Generator 31 receives power from Battery 30 via lines 55 and 56. Resistor 50 is placed in power supply connection between Battery 30 and Cellular Telephone 32. A voltage drop across Resistor 50 is converted to a digital signal by Analog-to-Digital Converter 36 and supplied to Microprocessor 37 for evaluation. It has been determined that a resistor of 35 milliohms can provide proper circuit operation without interfering with proper operation of a portable device.

Evaluation of a sensed power consumption pattern may include averaging of sensed power consumption values, integrating over a certain time period, differentiation for determining sudden changes, and comparing processed signals with previously measured and processed signals. Evaluations allow a microprocessor to identify characteristic patterns in a power consumption pattern which identify certain typical operations of a battery powered device, e.g., a cellular telephone. As described above, FIG. 1 illustrates an actual power consumption pattern of a typical cellular telephone performing a number of successive operations. Other battery powered devices, including other cellular telephones, may have different power consumption patterns associated with particular operations, and may exhibit different characteristic patterns for certain specific operations such as a response to an incoming call. The present invention may be programmed to monitor present and previously sensed power consumption patterns of different devices for identifying certain typical operations.

Figure 6A:
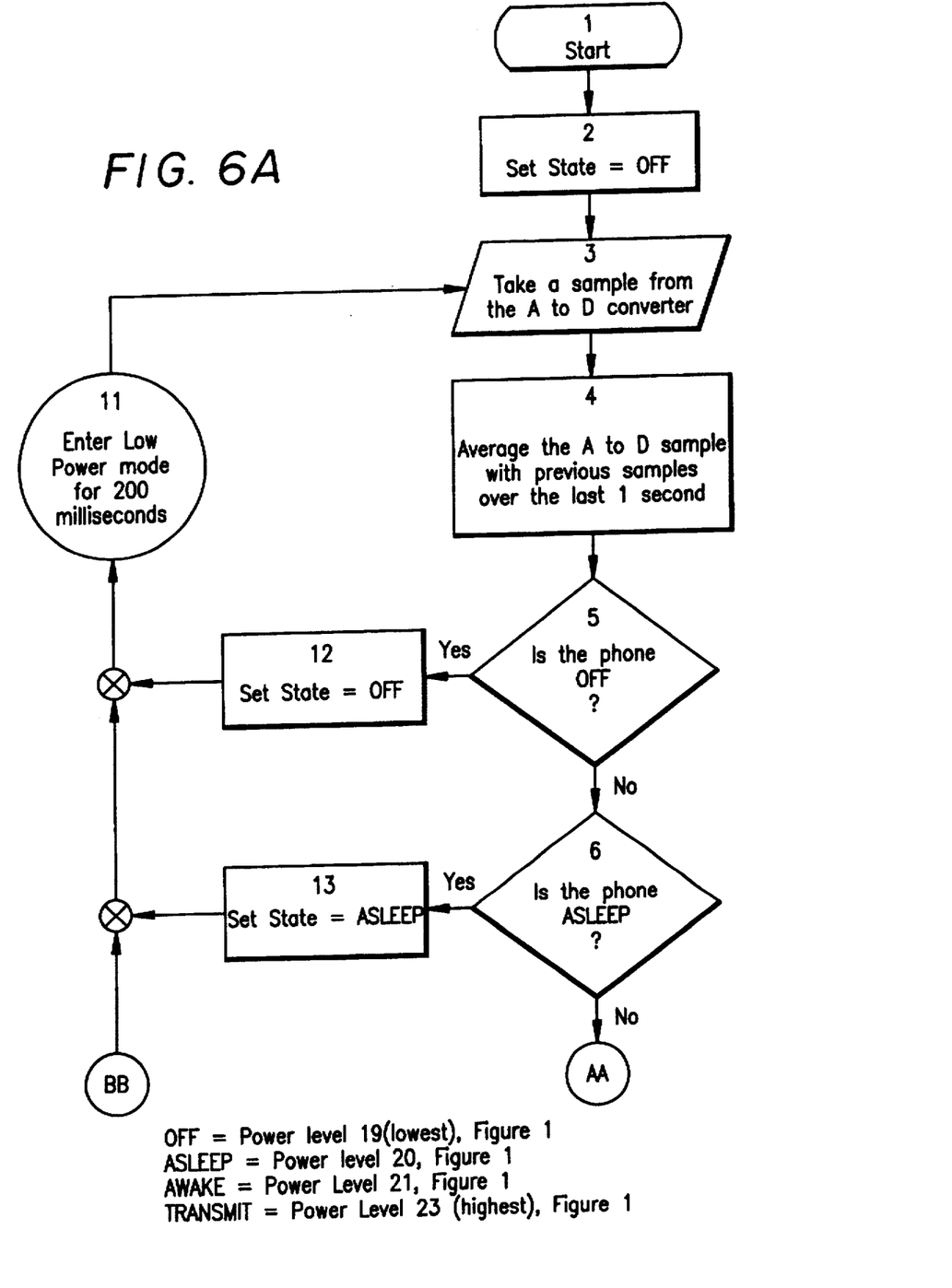
Figure 6B:
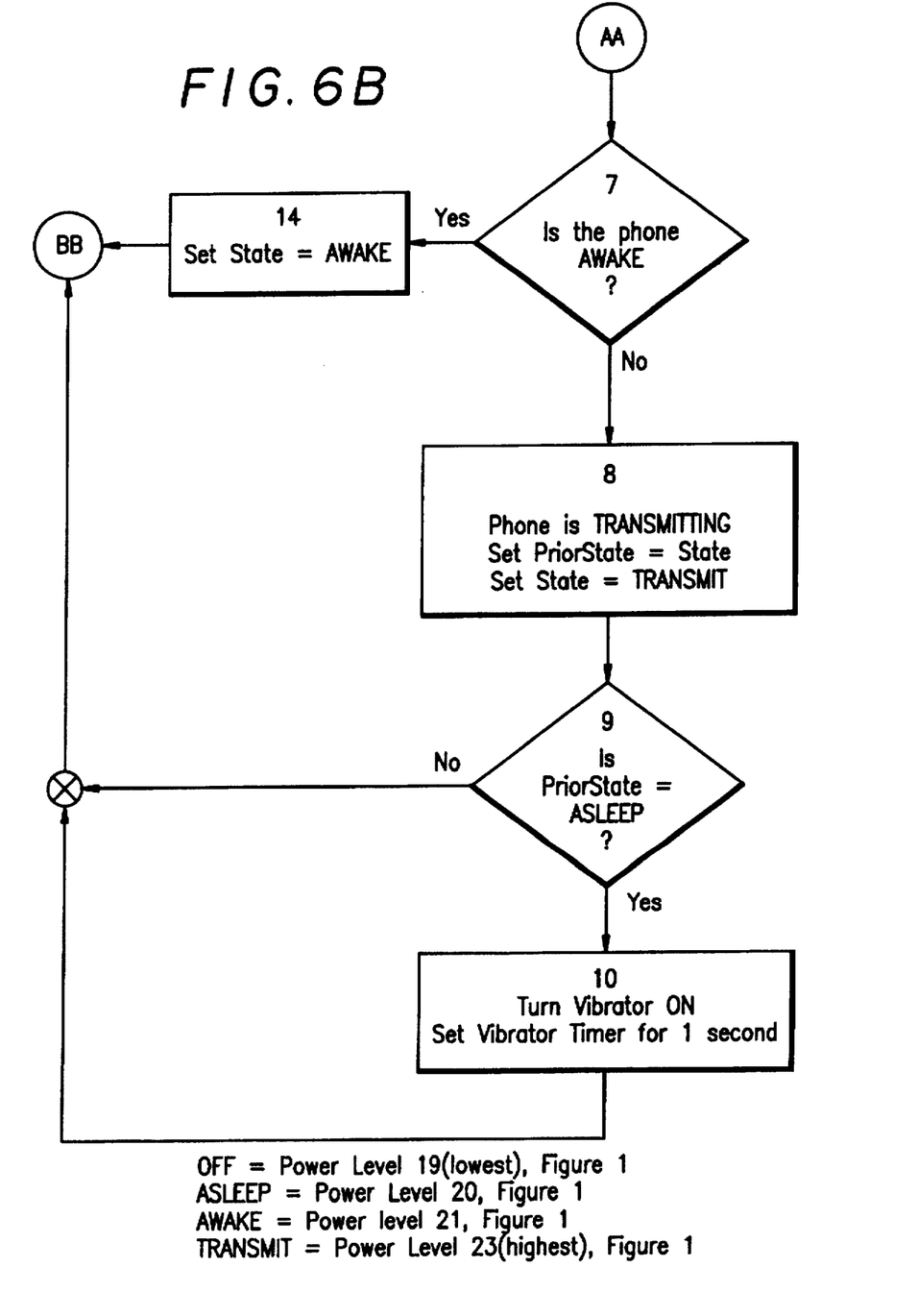

Instead of using voltage-drop Resistor 50 other standard electrical sensing means, such as a Magnetic Field Sensor (not shown), may be used to determine electrical characteristics in a power supply connection between Battery 30 and Cellular Telephone FIGS. 6A and 6B together comprise a flow chart illustrating an example of processing which may be performed by Microprocessor 37 in accordance with the present invention. FIG. 6A begins the program by setting a variable called "State" to OFF (Step 2). Microprocessor 37 then takes a sample from A-to-D Converter 36 (Step 3) and averages the sample with previous samples over the last second (Step 4). Microprocessor 37 then makes a determination as to whether the phone is in an OFF state (Step 5). If the phone is OFF (FIG. 1, Power Level 19), the variable "State" is set to OFF (Step 12), and the Event Sensor and Signal Generator 31 enters a low power mode for 200 milliseconds (Step 11) before returning to take a new sample from A-to-D Converter 36 at Step 3.

If the test at Step 5, however, indicates that the phone is not OFF, Microprocessor 37 tests to determine if the phone is ASLEEP (Step 6). If the phone is ASLEEP (FIG. 1, Power Level 20), "State" is set to ASLEEP, and the Event Sensor and Signal Generator 31 enters a low power mode for 200 milliseconds (Step 11) before returning to take a new sample from A-to-D Converter 36 at Step 3, as described above with respect to the phone being OFF.

If the test at Step 6 indicates the phone is not ASLEEP, however, the process continues (via AA to FIG. 6B). Microprocessor 37 tests the average to determine if the phone is AWAKE (Step 7). If the test indicates the phone is AWAKE (FIG. 1, Power Level 21), variable State is set to AWAKE (Step 14), and processing returns (via BB to FIG. 6A) to Step 11, entering a low power mode for 200 milliseconds before returning to take a new sample from A-to-D Converter 36 at Step 3.

If the test at Step 7 indicates that the phone is not AWAKE, the phone is transmitting (FIG. 1, Power Level 23), and variable "PriorState" is set to "State," and "State" is set to TRANSMIT (Step 8). Microprocessor 37 then determines if variable "PriorState" is set to ASLEEP (Step 9). If "PriorState" is not set to ASLEEP, processing returns (via BB to FIG. 6A) to Step 11, entering a low power mode for 200 milliseconds before returning to take a new sample from A-to-D Converter 36 at Step 3.

If "PriorState" is ASLEEP, the event is determined to be an incoming call and the selected Alert is turned on for a predetermined period or a period determined by Mode Switch 41, and processing returns (via BB to FIG. 6A) to Step 11, as discussed above.

In the above description, indications are provided for various different types of operations which may be implemented without difficulties by a skilled artisan. These variations relate mostly to adaptation to an environment, e.g. intensity and duration of signal, and to reduction of power consumption for extending operation before recharge or exchange of a battery is required.

MINIMIZATION OF FALSE ALERTS

In the above description of the operation of the Event Sensor and Alert Generator of the present invention in combination with a cellular telephone an alert is generated upon detection of certain power consumption patterns of a cellular telephone. Proper programming of a microprocessor can minimize false alerts by restricting generation of an alert to those events characterized by a certain duration of power consumption or a certain sequence of different power consumption levels. A microprocessor may also be programmed to detect certain frequencies in power consumption patterns of a cellular telephone which identify typical events on a communication path and in the operation of a cellular telephone. Such events are considered to be detectable as patterns of power consumption and useful in the minimization of false alerts.

FULLY CUSTOMIZABLE ALERT

In the above description of the operation of the Event Sensor and Alert Generator of the present invention it is contemplated that one embodiment of Microprocessor 37 and Alert Generator 38 includes a variety of alternative alerts, such as acoustical alerts, by providing a selection of short excerpts of digitized recorded music or sound bites in Control/Data Memory 42. It is also contemplated that a second embodiment of Microprocessor 37 and Alert Generator 38 includes a fully customizable, user programmable alert by implementing a portion of Control/Data Memory 42 as user programmable memory, such as flash memory, and implementing Connector 43 to provide an external connection to a readily available programming device, such as a serial or parallel connector of a PC.

A customized alert is programmed into Control/Data Memory 42 by a user by connecting Connector 43 to a PC and using the PC as a control and storage device to draw from a library of recorded digitized music or sound bites. A fully customized alert, such as a short sound bite in the user's own voice or another sound excerpt selected and recorded by the user, can also be programmed into Control/Data Memory 42.

While various preferred embodiments have been shown and described, it will be understood that there is no intent to limit the invention by such disclosure, but rather, is intended to cover all modifications and alternate constructions falling within the spirit and scope of the invention as defined in the appended claims.

We claim:

1. In a battery-powered system comprised of a portable electronic device for performing one or more functions and a battery for powering the portable electronic device, an apparatus for providing an alert, comprising:

an event sensor for sensing one or more characteristic power consumption patterns having specific frequencies associated with operation of a component of the device, wherein the sensed characteristic power consumption patterns relate to the occurrence of the one or more functions of the device;

the event sensor includes a pattern recognition circuit for evaluating the frequencies of the one or more characteristic power consumption patterns to identify the occurrence of the one or more functions of the portable electronic device; and, an alert generator for generating an alert upon the detection of the one or more characteristic power consumption patterns, relating to the occurrence of the one or more functions of the portable electronic device, sensed and evaluated by the event sensor; and wherein the alert provides an individual with a notice of the occurrence of the one or more functions of the portable electronic device.

2. The apparatus according to claim 1, wherein the event sensor and alert generator are located in a battery pack.

3. The apparatus according to claim 1, wherein the event sensor and alert generator are located in a housing for the device.

4. The apparatus according to claim 1, wherein the event sensor and alert generator are located in a housing separate from the device and battery.

5. The apparatus according to claim 1, wherein the pattern recognition circuit is a microprocessor programmed with pattern recognition software.

6. The apparatus according to claim 1, further comprising:
an on/off element for selectively activating and deactivating the apparatus.

7. The apparatus according to claim 1, further comprising:
a mode element for selectively activating one or more characteristics of the alert.

8. The apparatus of claim 1, wherein the alert generator comprises:
a vibrating alert.

9. The apparatus of claim 1, wherein the alert generator comprises:
a visual alert.

10. The apparatus of claim 1, wherein the alert generator comprises:
a preprogrammed acoustical alert.

11. The apparatus of claim 1, wherein the alert generator comprises:
a user programmable acoustical alert.

12. The apparatus according to claim 1, wherein the pattern recognition circuit is a hardwired device.

13. In a battery-powered system comprised of a portable electronic device for performing one or more functions and a battery for powering the portable electronic device, a method for providing an alert indicating an event, comprising:

sensing one or more power consumption patterns having specific frequencies associated with operation of a component of the device, wherein the one or more power consumption patterns relate to the occurrence of the one or more functions of the device;

evaluating the frequencies of the one or more characteristic power consumption patterns to identify the occurrence of the one or more functions of the portable electronic device; and, generating an alert upon the detection of the one or more characteristic power consumption patterns relating to the occurrence of the one or more functions of the device to provide an individual with a notice of the occurrence of the one or more functions of the portable electronic device.

14. The method according to claim 13, further comprising:
placing the event sensor and alert generator in a battery pack.

15. The method according to claim 13, further comprising:
placing the event sensor and alert generator in a housing enclosing the device.

16. The method according to claim 13, further comprising:
placing the event sensor and alert generator in a housing separate from the device and battery.

17. The method according to claim 13, wherein the step of evaluating includes programming an element to recognize one or more characteristic power consumption patterns.

18. The method according to claim 13, wherein the method further comprises:
selectively activating and deactivating the apparatus.

19. The method according to claim 13, wherein the method further comprises:

selectively activating one or more characteristics of the alert.

20. The method according to claim 13, wherein the generating comprises:

generating a vibrating alert.

21. The method according to claim 13, wherein the generating comprises:

generating a preprogrammed acoustical alert.

22. The method according to claim 13, wherein the generating comprises:

generating a user programmable acoustical alert.

23. The method according to claim 13, wherein the step of evaluating includes employing a hardwired device to recognize one or more characteristic power consumption patterns.

24. An external event sensor and alert generator for selective attachment to a battery powered portable telephone performing one or more functions, comprising:

an event sensor for sensing a characteristic power consumption pattern having a specific frequency associated with operation of a component of the battery powered portable telephone, wherein the characteristic power consumption pattern relates to receipt of an incoming call to the battery powered portable telephone;

the event sensor includes a microprocessor programmed with pattern recognition software for evaluating the frequency of the characteristic power consumption pattern to identify the receipt of an incoming call to the battery powered portable telephone; and, an alert generator for generating an alert upon the detection, by the event sensor, of the characteristic power consumption pattern relating to receipt of an incoming call to the battery powered portable telephone; and wherein the alert provides an individual with a notice of an incoming call to the battery powered portable telephone.

* * * * *